United States Patent [19]
Murakami

[11] Patent Number: 5,953,986
[45] Date of Patent: Sep. 21, 1999

[54] SCREEN PRINTER

[75] Inventor: Takehiko Murakami, Inagi, Japan

[73] Assignee: Minami Co. Ltd., Tokyo, Japan

[21] Appl. No.: 09/185,073

[22] Filed: Nov. 3, 1998

[51] Int. Cl.$^6$ .................................................. B05C 17/04
[52] U.S. Cl. .......................................... 101/123; 101/114
[58] Field of Search .................................. 101/123, 124, 101/114, 127

[56] References Cited

U.S. PATENT DOCUMENTS

| | | | |
|---|---|---|---|
| 2,739,530 | 3/1956 | McLaurin | 101/123 |
| 2,881,698 | 4/1959 | Graham | 101/123 |
| 4,121,519 | 10/1978 | Porth | 101/124 |
| 5,044,306 | 9/1991 | Erdmann | 101/123 |
| 5,845,572 | 12/1998 | Cronin et al. | 101/123 |

*Primary Examiner*—Edgar Burr
*Assistant Examiner*—Anthony H. Nguyen
*Attorney, Agent, or Firm*—Harold L. Novick; Nath & Associates

[57] ABSTRACT

To prevent a positional displacement of a screen mask in accordance with movement of a squeegee, a single squeegee device and a printing agent feeding device moves in synchronism with each other along a guide member. A squeegee elevated/lowered at a predetermined timing is mounted at a lower end of the squeegee device. A printing agent scraping device is mounted at a lower end of said printing agent feeding device. The printing agent scraping device is structured by a scraping frame which is elevated and lowered at a predetermined timing and moves in a direction in contact with or away from the squeegee and a printing agent extruding plate which is retracted/projected at a predetermined timing within the scraping frame.

2 Claims, 3 Drawing Sheets

SCREEN PRINTER

BACKGROUND OF THE INVENTION

The present invention relates to a screen printer, and more particularly to a screen printer for performing the printing operation only by the movement of a single squeegee in one direction.

A screen printer performs the printing operation by moving each squeegee along a top surface of a screen mask so that printing agent such as cream-like solder laid on the screen mask is shifted to a printed plate such as a printed substrate through through-holes formed in the screen mask.

In such conventional screen printer, two squeegees are used as the squeegees moved along the top surface of the screen mask and are moved in the opposite directions to each other.

Due to such operation, the extruding forces are repeatedly applied to the screen mask in the opposite directions. As a result, there is a fear that the screen mask would be displaced in position and it would be impossible to perform the correct printing for a pattern of the printed substrate which is a board to be printed on it.

SUMMARY OF THE INVENTION

In view of the foregoing defect, an object of the present invention is to provide a screen printer in which the printing operation is performed only by the movement of a single squeegee in one direction whereby the extruding force is not repeatedly applied in the opposite directions as in the conventional system.

According to the present invention, there is provided a screen printer characterized in that a single squeegee device and a printing agent feeding device is disposed in synchronism with each other on a screen mask along a guide member, the squeegee that is elevated/lowered at a predetermined timing is mounted at a lower end of said squeegee device, a printing agent scraping device is mounted at a lower end of said printing agent feeding device, and said printing agent scraping device is structured by a scraping frame which is elevated and lowered at a predetermined timing and moves in a direction in contact with or away from the squeegee and a printing agent extruding plate which is retracted/projected at a predetermined timing within said scraping frame.

A printing agent lateral leakage preventing frame may be mounted so as to surround both sides of the squeegee. In this case, it is possible to prevent the printing agent from leaking in the lateral direction and to effectively use the printing agent on the screen mask.

DESCRIPTION OF THE PREFERRED EMBODIMENTS

An embodiment of the present invention will now be described with reference to the accompanying drawings.

Figure 1:
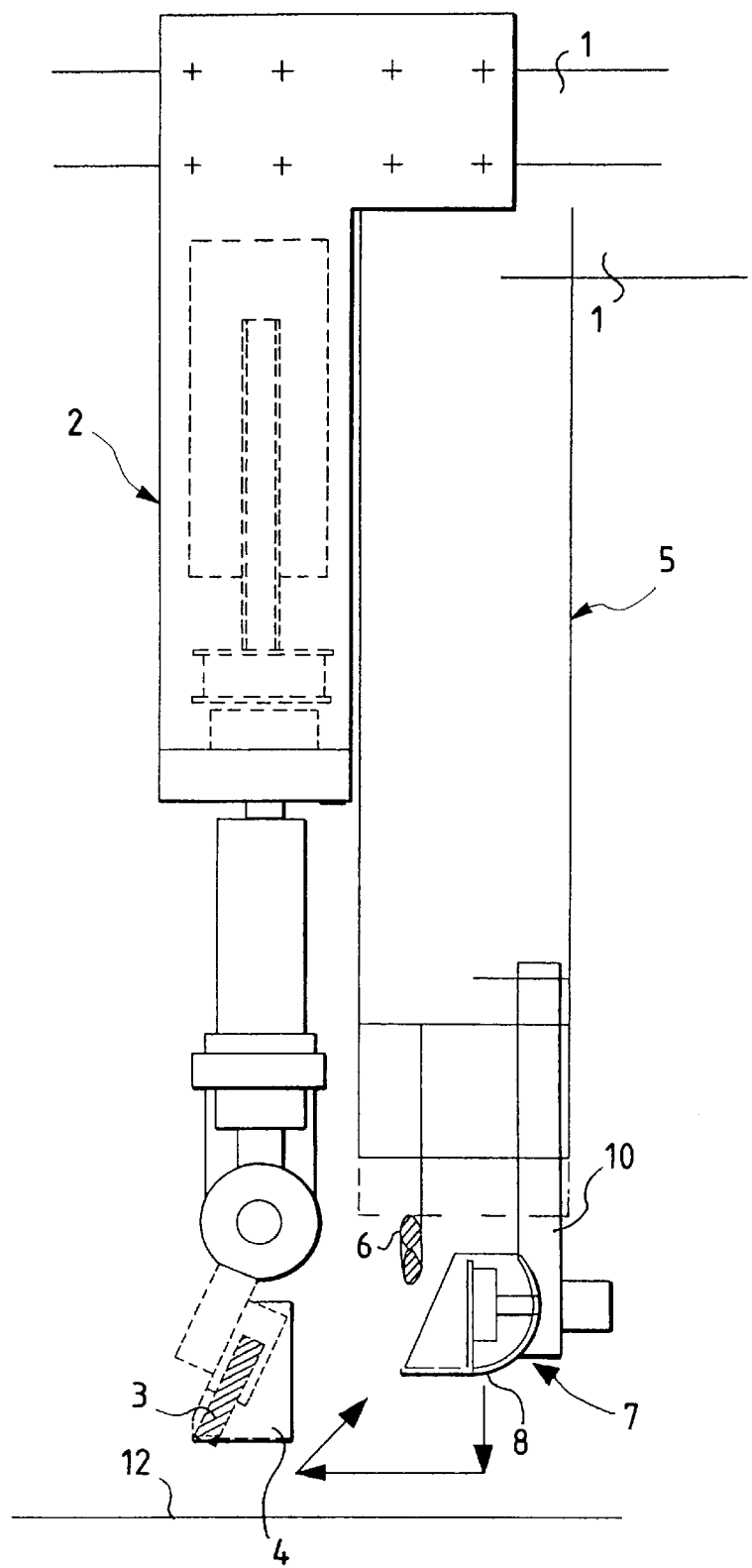
FIG. 1 is a front view showing an important part of the present invention.
Figure 2:
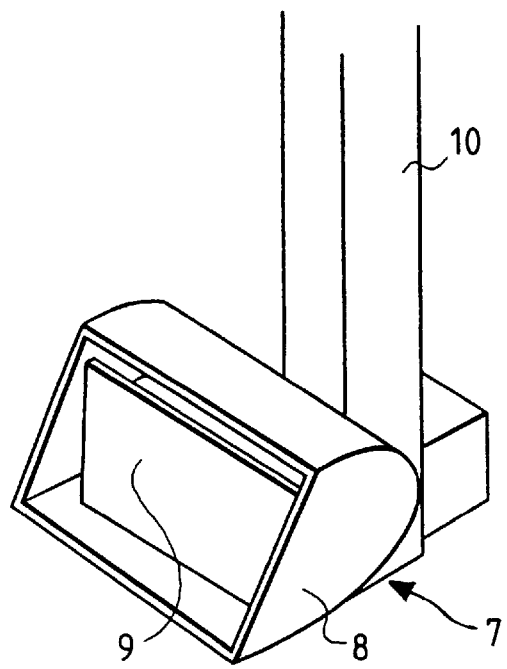
FIG. 2 is a perspective showing a printing agent scraping device.
Figure 4:
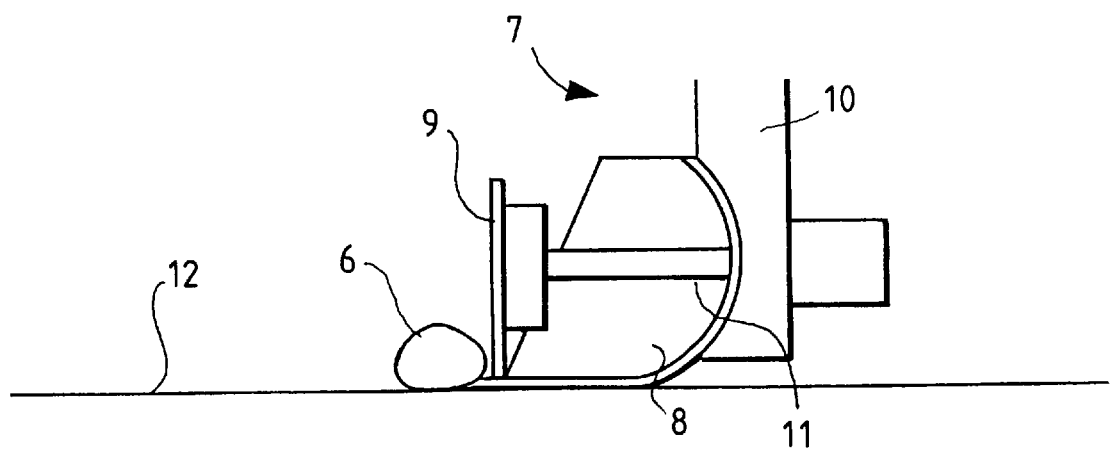
FIG. 4 is an illustration of the function of the printing agent scraping device and a cross-sectional view showing a state in which the printing agent is extruded onto a screen mask.
Figure 3:
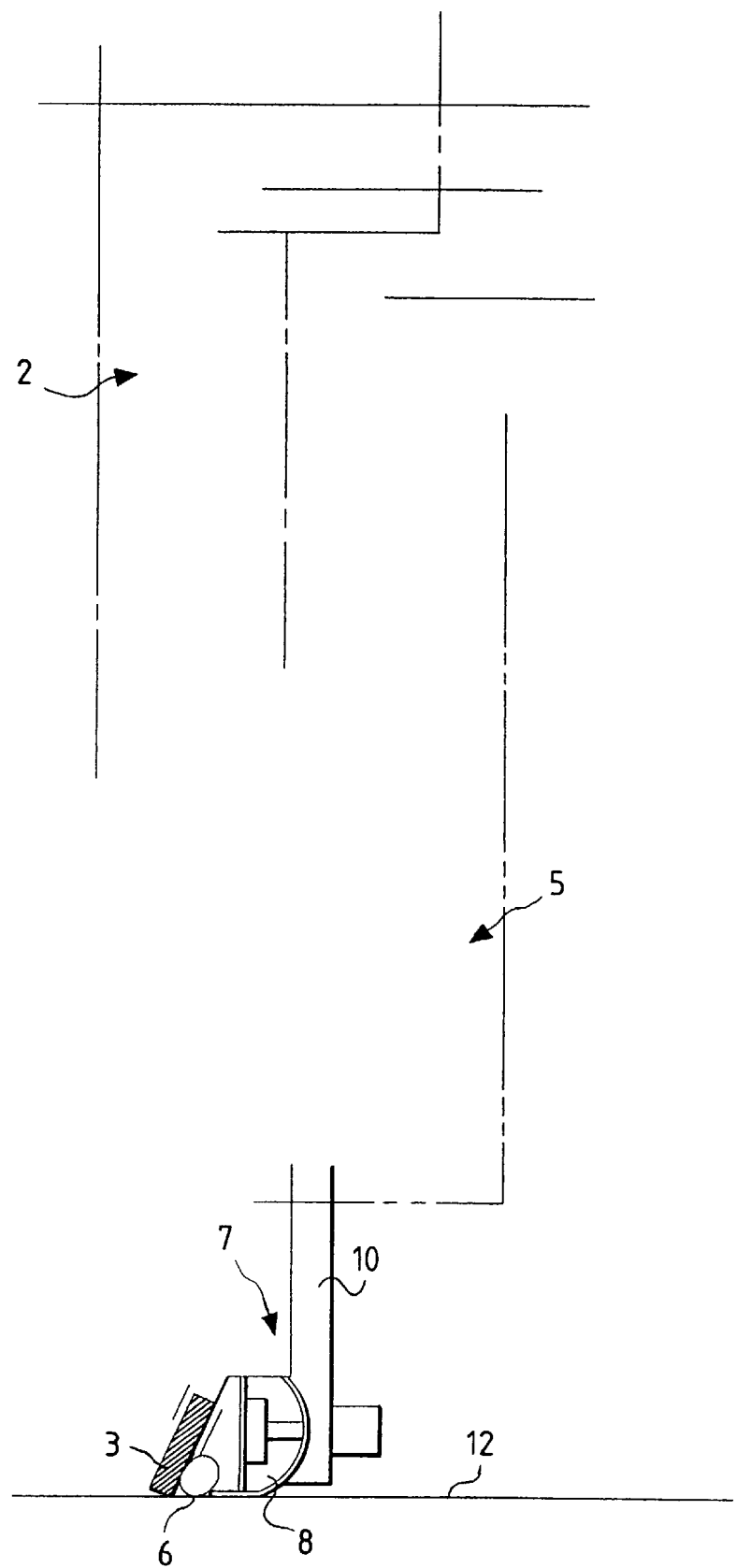
FIG. 3 is an illustration of the function of a printing agent scraping device and a cross-sectional view showing a state in which a printing agent has been scraped.

FIG. 1 is a front view showing an important part, FIG. 2 is a perspective showing a printing agent scraping device, and FIGS. 3 and 4 are illustrations of the function of the printing agent scraping device.

In the drawings, reference numeral 1 denotes a guide member, and numeral 2 denotes a squeegee device which moves along the guide member 1. Also, the squeegee device 2 is used for elevating/lowering a squeegee 3 attached to a lower end portion thereof at a predetermined timing. The structure therefor is the same as that of the well-known prior art.

Reference numeral 4 denotes a frame provided to surround both sides of the squeegee 3 for preventing the printing agent from leaking in the lateral direction.

Reference numeral 5 denotes a printing agent feeding device which moves along the guide member 1 in synchronism with the squeegee device 2. Also, numeral 6 denotes a cream-like solder as the printing agent.

Reference numeral 7 denotes a printing agent scraping device attached to the lower end of the printing agent feeding device 5. Also, the printing agent scraping device 7 is composed of a scraping frame 8 which moves in a direction in contact with or away from the above-described squeegee 3 and up and down at a predetermined timing, and a printing agent extruding plate 9 which is retracted or projected at a predetermined timing within the scraping frame 8. Also, numeral 10 denotes a support rod for the scraping frame 8 and numeral 11 denotes an operating mechanism for the above-described printing agent extruding plate 9.

Reference numeral 12 denotes a screen mask in which through holes (not shown) are formed in a well known manner. The screen mask 12 is set on a support base (not shown).

The operation of the embodiment will now be described.

In the same manner as the manner of the prior art, the squeegee 3 moves on and along the screen mask 12 while pushing the printing agent 6 fed by the printing agent feeding device 5.

Then, in the embodiment, when the squeegee 3 reaches a movement terminal position, as shown in FIG. 3, the printing agent scraping device 7 is lowered to approach the squeegee 3 so as to scrape the screen mask 12. As a result, the printing agent 6 on the screen mask 12 is scraped into the scraping frame 8.

After this operation, the squeegee 3 and the printing agent scraping device 7 are elevated. Incidentally, the printing agent scraping device 7 is retracted back away from the squeegee 3 while moving upwardly.

Then, the squeegee 3 and the printing agent scraping device 7 are moved again toward the original position away from the screen mask 12.

Then, when these components are returned back to the start position of the movement, the squeegee 3 and the printing agent scraping device 7 are again lowered toward the screen mask 12. Then, as shown in FIG. 4, the printing agent extruding plate 9 of the printing agent device 7 is moved forwardly, thereby extruding the printing agent 6 onto the screen mask 12. Thereafter, in the same manner as in the prior art, the squeegee 3 is moved for printing.

According to the present invention, with the structure and operation as described above, the printing operation is performed only by the movement of the single squeegee in one direction. The extruding force is not repeatedly applied to the screen mask in the opposite directions as in the prior art. As a result, the positional displacement of the screen mask may be prevented.

Also, if the printing agent lateral leakage preventing frame is mounted so as to surround both sides of the squeegee, it is possible to prevent the printing agent from leaking in the lateral direction when the squeegee is moved while extruding the agent. As a result, it is possible to effectively use the printing agent on the screen mask.

Various details of the invention may be changed without departing from its spirit nor its scope. Furthermore, the foregoin description of the embodiments according to the present invention is provided for the purpose of illustration only, and not for the purpose of limiting the invention as defined by the appended claims and their equivalents.

What is claimed is:

1. A screen printer that prints on a screen mask, said printer comprising
   a single squeegee device;
   a printing agent feeding device disposed to move in synchronism with said squeegee device on the screen mask;
   a guide member which guides the motion of said printing agent feeding device and said squeegee device on said screen mask;
   a squeegee which can be elevated/lowered at predetermined times and is mounted at a lower end of said squeegee device;
   a printing agent scraping device mounted at a lower end of said printing agent feeding device, said printing agent scraping device having
      a scraping frame which can be elevated and lowered at predetermined times and which moves in a direction in contact with or away from said squeegee; and
      a printing agent extruding plate which can be retracted/projected at predetermined times within said scraping frame.

2. The screen printer according to claim 1, wherein said scraping frame surrounds both sides of the squeegee for preventing lateral leakage of the printing agent.

* * * * *